(12) United States Patent
Manning (10) Patent No.: US 6,548,339 B2
(45) Date of Patent: Apr. 15, 2003

(54) METHODS OF FORMING MEMORY CIRCUITRY, AND METHOD OF FORMING DYNAMIC RANDOM ACCESS MEMORY (DRAM) CIRCUITRY

(75) Inventor: H. Montgomery Manning, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/848,704

(22) Filed: May 2, 2001

(65) Prior Publication Data

US 2001/0018246 A1 Aug. 30, 2001

Related U.S. Application Data

(62) Division of application No. 08/855,517, filed on May 13, 1997, now Pat. No. 6,258,671.

(51) Int. Cl.$^7$ .......................................... H01L 21/8242
(52) U.S. Cl. ...................... 438/210; 438/200; 438/239; 438/241; 438/253; 438/588
(58) Field of Search .................................. 438/200, 210, 438/238, 239, 241, 253, 587, 588

(56) References Cited

U.S. PATENT DOCUMENTS

| | | | |
|---|---|---|---|
| 4,931,411 A | 6/1990 | Tigelaar et al. ............. 437/192 |
| 5,005,066 A | 4/1991 | Chen ........................ 357/43 |
| 5,021,354 A | * 6/1991 | Pfiester ..................... 438/230 |
| 5,034,798 A | 7/1991 | Ohsima ..................... 357/54 |
| 5,126,290 A | 6/1992 | Lowrey et al. ............. 437/235 |
| 5,134,085 A | * 7/1992 | Gilgen et al. .............. 438/210 |
| 5,164,806 A | 11/1992 | Nagatomo et al. .......... 257/395 |
| 5,175,120 A | 12/1992 | Lee ............................. 437/48 |
| 5,289,422 A | 2/1994 | Mametani ................... 365/210 |
| 5,292,681 A | 3/1994 | Lee et al. ..................... 437/48 |

(List continued on next page.)

FOREIGN PATENT DOCUMENTS

| JP | 2 253 937 A | 9/1992 |
|---|---|---|
| JP | 09064294 A | 3/1997 |

Primary Examiner—Amir Zarabian
Assistant Examiner—Toniae M. Thomas
(74) Attorney, Agent, or Firm—Wells St. John P.S.

(57) ABSTRACT

Methods of forming conductive lines and insulative spacers thereover are described. In accordance with one aspect of the invention, a substrate is provided having a first area and a second area relative to which conductive lines are to be formed. A layer of conductive material is formed over the first and second substrate areas and a layer of insulative material is formed over the conductive material. In a preferred implementation, insulative material is removed from the second area and conductive lines are subsequently patterned and etched in both the first and second areas. In another preferred implementation, conductive lines are first patterned and etched with insulative material in the second area being subsequently removed. The patterned and etched conducted lines have respective sidewalls. Subsequently, a layer of insulative material is formed over the substrate, the conductive lines, and the respective sidewalls thereof, and in at least one common etching step, the insulative material is etched to a degree sufficient to form sidewall spacers over the respective sidewalls. In accordance with one aspect, the one common etching step comprises an anisotropic etching step. In accordance with another aspect, the one common etching step comprises at least one facet etching step.

15 Claims, 6 Drawing Sheets

U.S. PATENT DOCUMENTS

| | | | | |
|---|---|---|---|---|
| 5,329,482 | A | 7/1994 | Nakajima et al. | 257/344 |
| 5,346,585 | A | 9/1994 | Doan et al. | 156/643 |
| 5,356,834 | A | 10/1994 | Sugimoto et al. | 437/190 |
| 5,439,846 | A | 8/1995 | Nguyen et al. | 437/187 |
| 5,483,104 | A * | 1/1996 | Godinho et al. | 257/758 |
| 5,550,078 | A * | 8/1996 | Sung | 438/210 |
| 5,567,642 | A * | 10/1996 | Kim et al. | 438/232 |
| 5,668,035 | A | 9/1997 | Fang et al. | 438/239 |
| 5,733,809 | A | 3/1998 | Dennison et al. | 438/253 |
| 5,739,068 | A | 4/1998 | Jost et al. | 438/637 |
| 5,759,889 | A | 6/1998 | Sakao | 438/241 |
| 5,763,954 | A | 6/1998 | Hyakutake | 257/774 |
| 5,780,882 | A | 7/1998 | Sugiura et al. | 257/203 |
| 5,792,684 | A * | 8/1998 | Lee et al. | 438/238 |
| 5,821,600 | A | 10/1998 | Chan | 257/508 |
| 5,858,865 | A * | 1/1999 | Juengling et al. | 438/585 |
| 5,863,820 | A * | 1/1999 | Huang | 438/241 |
| 5,898,006 | A | 4/1999 | Kudoh | 438/275 |
| 5,930,618 | A * | 7/1999 | Sun et al. | 438/240 |
| 5,972,764 | A * | 10/1999 | Huang et al. | 438/305 |
| 6,069,037 | A * | 5/2000 | Liao | 438/241 |
| 6,136,677 | A * | 10/2000 | Prein | 438/592 |
| 6,153,459 | A * | 11/2000 | Sun | 438/238 |
| 6,291,279 | B1 * | 9/2001 | Hsiao et al. | 438/197 |
| 6,335,236 | B1 * | 1/2002 | Mori | 438/221 |
| 6,338,993 | B1 * | 1/2002 | Lien | 438/238 |
| 2001/0016407 | A1 * | 8/2001 | Schoenfeld et al. | 438/618 |

\* cited by examiner

METHODS OF FORMING MEMORY CIRCUITRY, AND METHOD OF FORMING DYNAMIC RANDOM ACCESS MEMORY (DRAM) CIRCUITRY

RELATED PATENT DATA

This patent resulted from a divisional application of U.S. patent application Ser. No. 08/855,517, filed May 13, 1997 now U.S. Pat. No. 6,258,671, entitled "Methods of Providing Spacers Over Conductive Line Sidewalls, Methods of Forming Sidewall Spacers Over Etched Line Sidewalls, And Methods of Forming Conductive Lines", naming H. Montgomery as inventor, the disclosure of which is incorporated by reference.

TECHNICAL FIELD

This invention relates to methods of forming conductive lines, insulative spacers over conductive line sidewalls, and memory circuitry.

BACKGROUND OF THE INVENTION

Fabrication of integrated circuitry involves the formation of conductive lines over a substrate. Such conductive lines are used to connect to or with device components. One type of integrated circuitry is memory circuitry. Memory circuitry typically includes a memory array in which storage devices are fabricated as close as lithography allows in order to conserve wafer space. Memory circuitry also typically includes peripheral circuitry in which spacing requirements are not as paramount as in the memory array. Accordingly, devices in the peripheral circuitry are typically spaced further apart relative to devices in the memory array.

The disparity in spacing between conductive lines in the memory array relative to those lines in the peripheral area leads to a problem which this invention addresses. Specifically, conductive lines typically include sidewall spacers which electrically insulate sides of the conductive lines. The sidewall spacers are typically formed by forming a layer of insulative material over the substrate and anisotropically etching the layer to leave spacers about the conductive lines.

It is well known that the conformality of deposited insulative material over closely spaced conductive lines is worse than on lines which are spaced further apart. Because of this, peripheral devices tend to have larger dimensioned spacers than array devices. Such larger dimensions typically manifest in larger lateral spacer width dimensions. Because the spacer dimension is typically set by the processing required to optimize devices in the memory array, the peripheral devices can be compromised by having larger spacers than would be the case if the spacers were optimized for the peripheral devices. Larger dimensioned spacers adversely affect electrical properties associated with the lines and degrade device performance. Device reliability may also suffer if lightly doped drain regions are not used. Such is typically the case in some low $V_{cc}$ processes.

This invention arose out of concerns associated with providing methods to enhance the performance of peripheral devices without compromising the performance of the array devices.

SUMMARY OF THE INVENTION

Methods of forming conductive lines and insulative spacers thereover are described. In accordance with one aspect of the invention, a substrate is provided having a first area and a second area relative to which conductive lines are to be formed. A layer of conductive material is formed over the first and second substrate areas and a layer of insulative material is formed over the conductive material. In a preferred implementation, insulative material is removed from the second area and conductive lines are subsequently patterned and etched in both the first and second areas. In another preferred implementation, conductive lines are first patterned and etched with insulative material in the second area being subsequently removed. The patterned and etched conducted lines have respective sidewalls. Subsequently, a layer of insulative material is formed over the substrate, the conductive lines, and the respective sidewalls thereof, and in at least one common etching step, the insulative material is etched to a degree sufficient to form sidewall spacers over the respective sidewalls. In accordance with one aspect, the one common etching step comprises an anisotropic etching step. In accordance with another aspect, the one common etching step comprises at least one facet etching step.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
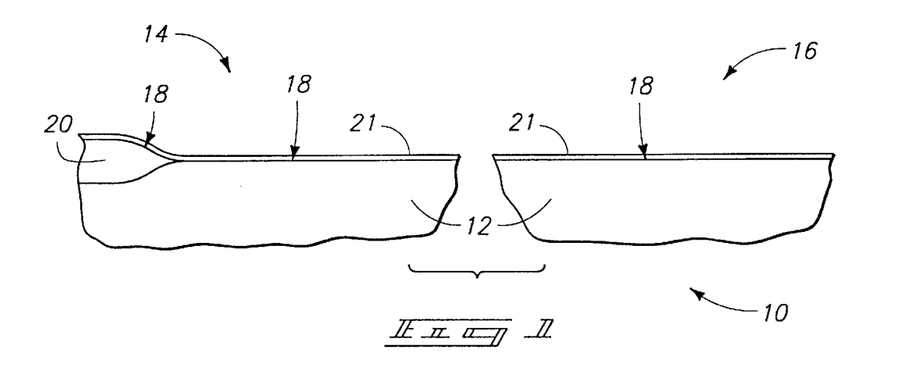
FIG. 1 is a diagrammatic sectional view of a semiconductor wafer fragment at one processing step in accordance with one embodiment of the invention.

Referring to FIG. 1, a semiconductor wafer fragment in process is indicated generally by reference numeral 10 and includes a semiconductive substrate 12. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

The illustrated substrate 12 includes a first area 14 and a second area 16. In a preferred implementation, first area 14 constitutes a memory array area or memory array for supporting memory integrated circuitry, and second area 16 constitutes a peripheral area or periphery which is spaced from the memory array and supports peripheral circuitry. According to one aspect of the invention, the memory array area constitutes a portion of a static random access memory device or SRAM. According to another aspect of the invention, the memory array area constitutes a portion of a dynamic random access memory device or DRAM. Areas 14 and 16 include isolation oxide regions which provide isolation relative to circuitry which will be formed. An exemplary fragmentary isolation oxide region is indicated at 20. Areas 14 and 16 include an outer surface 18 relative to which conductive lines are to be formed. Outer surface 18 can constitute a non-planar outer surface. A thin oxide layer 21 is provided over outer surface 18 and constitutes a gate oxide layer for conductive lines or transistor gates which are to be formed.

Figure 2:
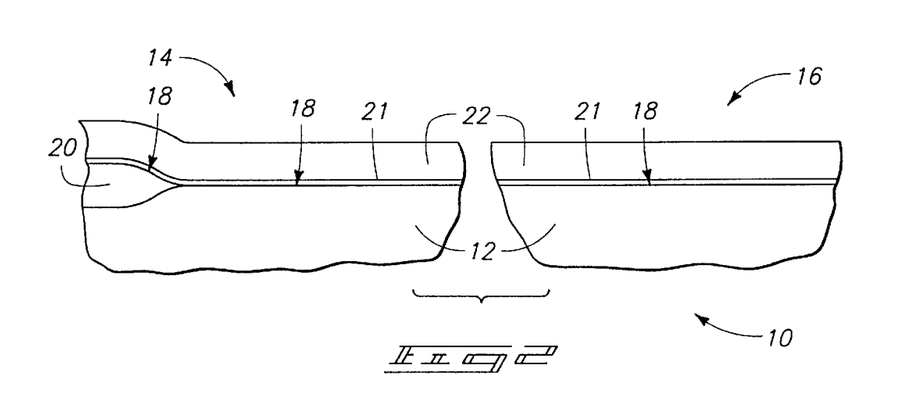
FIG. 2 is a view of the FIG. 1 wafer at a processing step subsequent to that shown by FIG. 1.

Referring to FIG. 2, a layer 22 of conductive material is formed over substrate 12 and first and second substrate areas 14, 16 respectively. A suitable material for layer 22 is conductively doped polysilicon.

Figure 3:
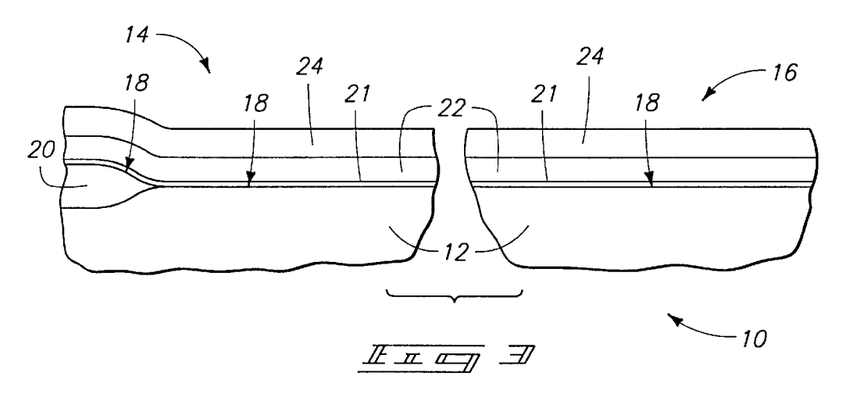
FIG. 3 is a view of the FIG. 1 wafer at a processing step subsequent to that shown by FIG. 2.

Referring to FIG. 3, a layer of conductive material, and preferably a refractory metal layer, is formed over the substrate and reacted to form a conductive silicide layer 24. A suitable material for layer 24 is $WSi_x$. It is to be understood, however, that the above-described specific conductive layers are utilized for illustrative purposes only. Accordingly, conductive materials other than those discussed above, either alone or in combination with other conductive materials can be used.

Figure 4:
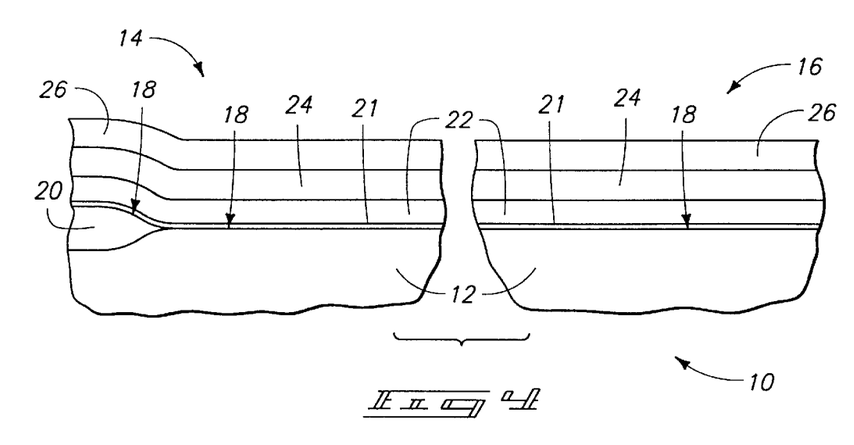
FIG. 4 is a view of the FIG. 1 wafer at a processing step subsequent to that shown by FIG. 3.

Referring to FIG. 4, a layer 26 of first insulative material is formed over conductive material layer 24. According to one aspect of the invention, such insulative material is formed over both areas 14, 16 at the same time. It is possible, however, for first insulative material to be formed over only one of the areas. It is also possible, in certain implementations, for first insulative material to be formed over only portions of both areas, or, over area 14 and only portions of area 16. $SiO_2$ is an example material for insulative layer 26.

Figure 5:
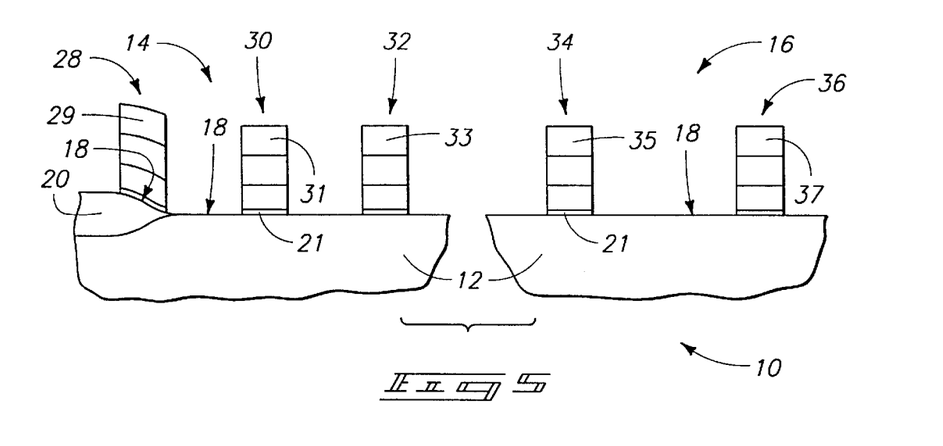
FIG. 5 is a view of the FIG. 1 wafer at a processing step subsequent to that shown by FIG. 4.
Figure 7:
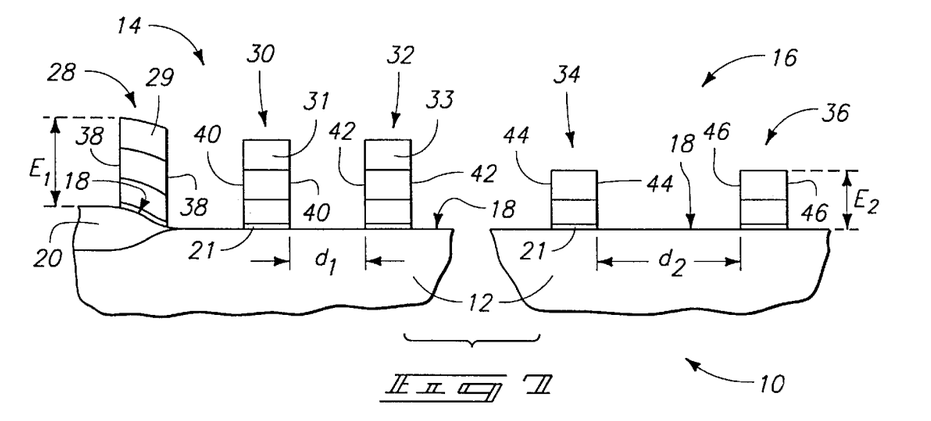
FIG. 7 is a view of the FIG. 1 wafer fragment at a processing step subsequent to that shown by either of FIGS. 5 or 6.

Referring to FIG. 5, and in accordance with one implementation of the invention, the conductive material of layers 22, 24 (FIG. 4) and first insulative material layer 26 are patterned and etched to form conductive lines 28, 30, and 32 in first area 14, and conductive lines 34, 36 in second area 16. Accordingly, individual conductive lines in both areas 14 and 16 include respective insulative or insulating caps 29, 31, 33, 35, and 37. The term "conductive line" as used in this document will be understood to mean a conductive line construction which may or may not include insulative or insulating portions or caps such as caps 29, 31, 33, 35, and 37. Subsequently, after the patterning and etching of the conductive lines, insulative material forming insulating caps 35 and 37 is removed from second area 16 to provide a resultant conductive line construction which is shown in FIG. 7. The removal of insulating caps 35 and 37 can, and preferably does take place through a suitable masked etch thereof. It will be understood that in certain implementations, it may be desirable to remove only some of the insulating caps from conductive lines in peripheral area 16. Such would be the case, for example, when fabricating electrostatic discharge (ESD) devices where having a larger spacer dimension is desirable. Such constitutes removing insulative material from over less than all of a plurality of etched lines. Accordingly, the lines over which the insulative material is removed (lines 34, 36 in FIG. 7) are shorter than lines over which the insulative material is not removed (lines 28, 30, and 32).

Figure 6:
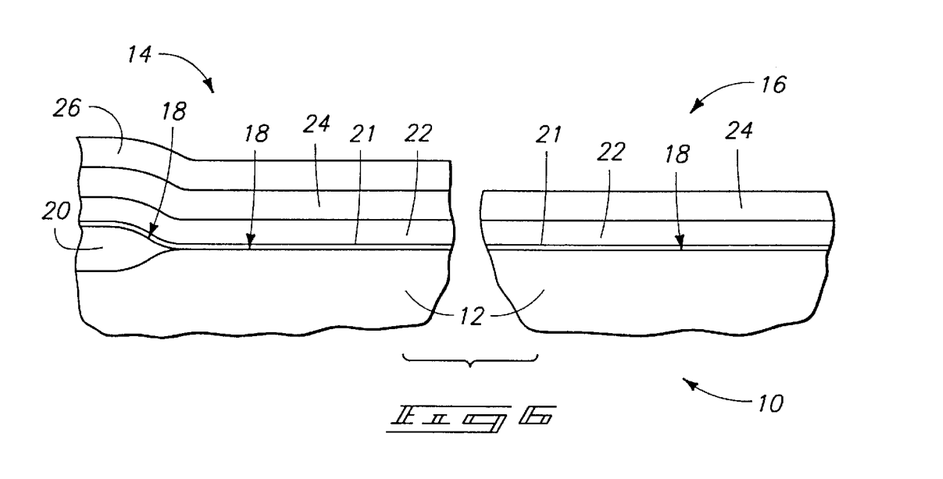
FIG. 6 is a view of the FIG. 4 wafer at a processing step in accordance with an alternate embodiment of the invention.

Referring to FIG. 6, another implementation of the invention is set forth, and is one which follows from the FIG. 4 construction. Accordingly, insulative material 26 (FIG. 4) from over the conductive material in second area 16 is removed prior to the formation of any conductive lines in such area. Such constitutes one example of forming a layer of insulative material 26 over the conductive material in first area 14 while leaving conductive material in second area 16 exposed. Accordingly, in the resultant FIG. 6 construction, insulative material is formed over conductive material in the first area only. The removal of the insulative material from second area 16 is preferably effectuated through a masked etch thereof. After the forming of the insulative material layer as just described, the conductive material of layers 22 and 24 is patterned and etched to form conductive lines in both first and second substrate areas 14, 16 as shown in FIG. 7. As with the FIG. 5 implementation discussed above relative to fabricating ESD devices, it may be desirable in certain implementations to leave insulative material over portions of peripheral area 16. Processing in this instance would proceed as described just above.

Referring to FIG. 7 and in accordance with a preferred aspect of the invention, conductive lines 28, 30, and 32 constitute conductive lines which are disposed in the memory array area and spaced as close together as lithography permits. Such line spacing constitutes a first line spacing which is indicated by a first distance $d_1$ which constitutes a minimum lithographic spacing dimension. Area 16 constitutes a peripheral area in which the illustrated conductive lines 34, 36 are disposed and laterally spaced relative to one another a second line spacing which is indicated by a second distance $d_2$ which is different from $d_1$. In the illustrated example, $d_2$ is greater than $d_1$. Accordingly, at least some of the lines have line spacings relative to adjacent lines which are different from line spacings of other lines relative to other adjacent lines.

Conductive lines 28, 30, 32, 34, and 36 include respective sidewalls 38, 40, 42, 44, and 46. Sidewalls 38, 40, and 42 define line elevations $E_1$ relative to outer surface 18 in first area 14. Sidewalls 44 and 46 define line elevations $E_2$ relative to outer surface 18 in second area 16. $E_1$ and $E_2$ are preferably different as between first area 14 and second area 16. The difference in line elevations stems from the conductive lines in first area 14 having insulative caps and the conductive lines in second area 16 not having insulative caps. Accordingly, line elevations relative to surface 18 in first area 14 are greater than line elevations in second area 16. Conductive lines 28, 30, and 32 constitute first conductive lines and conductive lines 34 and 36 constitute second conductive lines. The first conductive lines project elevationally outward from outer surface 18 a greater distance than the second conductive lines project. Accordingly, at least some of the conductive lines project outward relative to the substrate outer surface a greater distance than other conductive lines. Alternately considered, at least some of the first area conductive lines have aspect ratios (height-to-width ratios) which are greater than aspect ratios of at least some of the second area conductive lines.

Figure 8:
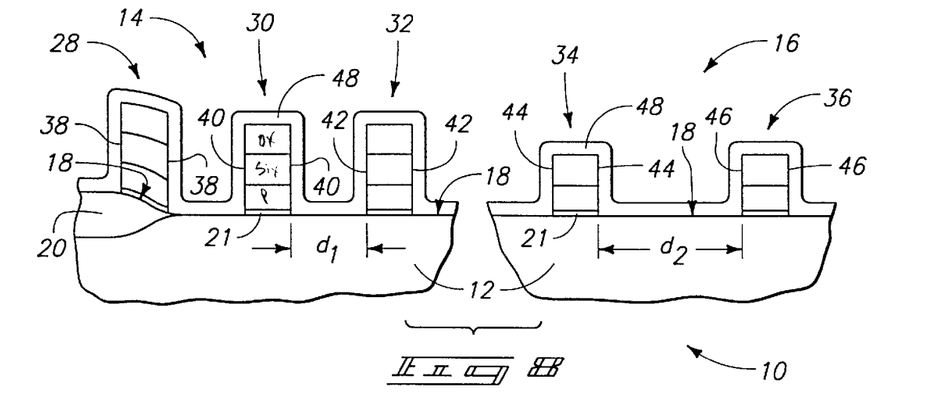
FIG. 8 is a view of the FIG. 1 wafer at a processing step subsequent to that shown by FIG. 7.

Referring to FIG. 8, a layer 48 of insulative spacer material is formed over the substrate and conductive lines 28, 30, 32, 34, and 36. Typically, layer 48 is provided through decomposition of tetraethylorthosilicate (TEOS). Layer 48 constitutes a second insulative material.

Figure 9:
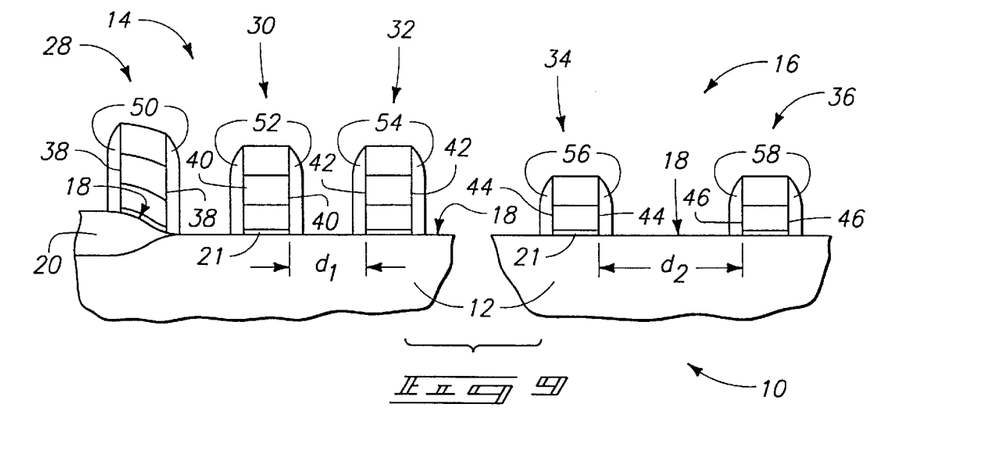
FIG. 9 is a view of the FIG. 1 wafer at a processing step subsequent to that shown by FIG. 8.

Referring to FIG. 9 and in accordance with one aspect of the invention, at least one common etching step is conducted and etches insulative material 48 in both areas 14 and 16. Such provides respective resultant insulative sidewall spacers 50, 52, 54, 56, and 58 which are operably disposed over their respective conductive line sidewalls. In accordance with one preferred aspect of the invention, a common anisotropic etching of insulative material 48 forms the illustrated sidewall spacers. In accordance with another preferred aspect of the invention, the etching of the sidewall spacers includes a common facet etching of insulative material 48. Typically, an initial facet etching of layer 48 takes place which is followed by deposition of additional insulative material. Subsequently, an anisotropic etch to form resultant spacers, or, additional depositions and facet etchings can take place. In the latter case, an anisotropic etch can be incorporated into the etching sequence (after multiple deposition/facet etching steps) to provide a resultant spacer construction. Accordingly, such would constitute conducting at least two facet etchings. Preferably, the sidewall spacers which are formed relative to the shorter of the conductive lines (lines 34, 36) have lateral width dimensions which are substantially equal to the lateral width dimensions of the sidewall spacers of the taller of the conductive lines (lines 28, 30, and 32). Accordingly, such constitutes forming sidewall spacers relative to the shorter and more laterally distant lines, the sidewall spacers having reduced spacer widths than would otherwise occur in the presence of the removed or etched insulative material. Alternately considered and in accordance with one aspect of the invention, spacers having substantially common width dimensions are formed over conductive lines having different heights.

Figure 10:
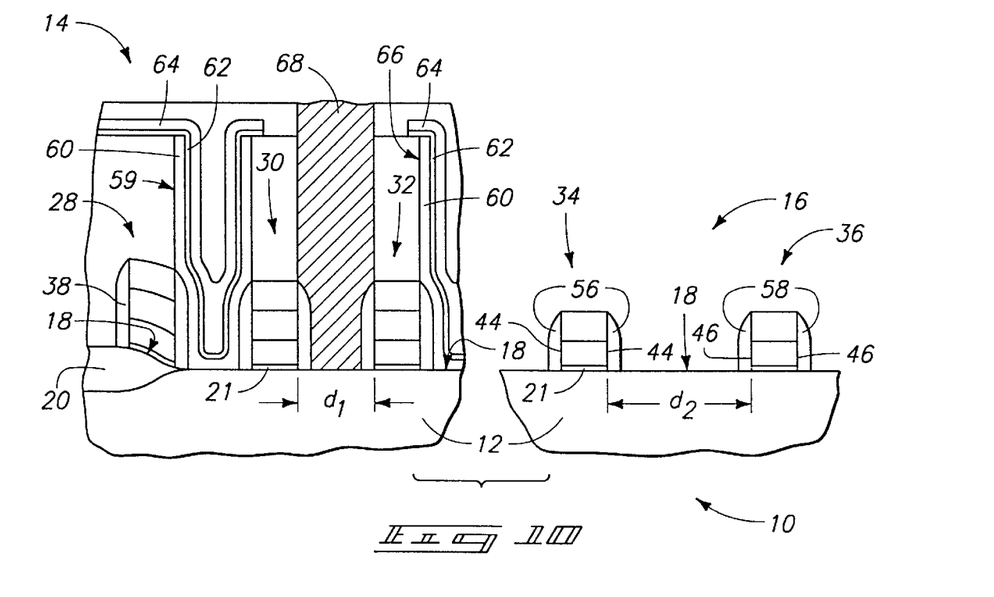
FIG. 10 is a view of the FIG. 1 wafer at a processing step subsequent to that shown by FIG. 9.

Referring to FIG. 10 and in accordance with one aspect of the invention, dynamic random access memory (DRAM) circuitry is formed relative to memory array area 14. Accordingly, a storage capacitor 59 includes a layer 60 of storage node material which is formed over memory array area 14 and between at least some of the conductive lines. A layer 62 of dielectric material is formed over storage node material layer 60. A cell plate layer 64 is subsequently formed operatively adjacent dielectric layer 62 to provide a storage capacitor. Other storage capacitors are similarly formed and operably disposed within the memory array area. A fragmentary portion of one such storage capacitor is indicated at 66. A bit line contact 68 is formed adjacent and operably associated with storage capacitors 59, 66. Bit line contact 68 is suitably insulated from the storage capacitors.

Figure 11:
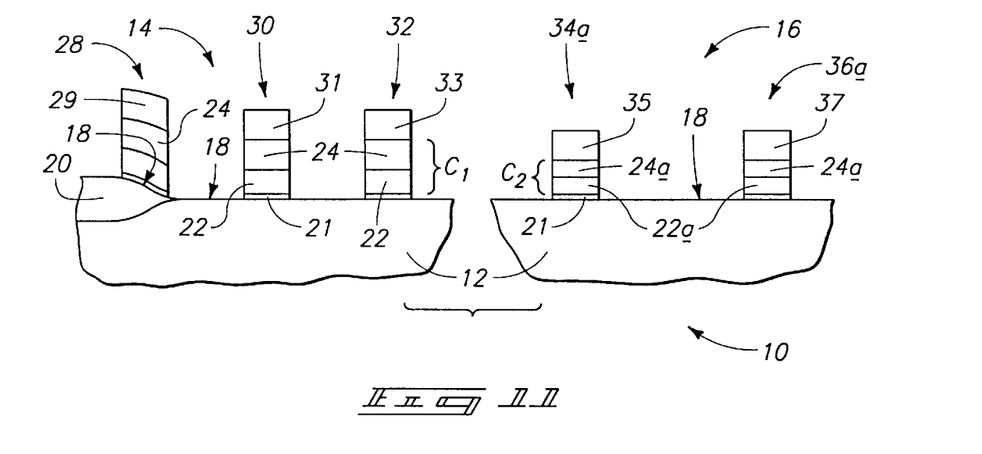
FIG. 11 is a view of a semiconductor wafer fragment at one processing step in accordance with an alternate embodiment of the invention.

Referring to FIG. 11, an alternate embodiment is shown. Like numbers from the above-described embodiment(s) are utilized where appropriate, with differences being indicated with the suffix "a" or with different numerals. In the illustrated embodiment, conductive lines 28, 30, and 32 have conductive portions $C_1$ comprised of layers 22, 24. Conductive lines 34a and 36a have conductive portions $C_2$ comprised of layers 22a and 24a. Conductive lines 28, 30, and 32 project outwardly from substrate outer surface 18 a greater distance than conductive lines 34a and 36a project. In the illustrated example, the conductive portions $C_1$ project a greater distance relative to the substrate outer surface than conductive portions $C_2$. Accordingly, respective conductive portions $C_1$ are greater in elevational height or thickness than respective conductive portions $C_2$. Insulative caps 29, 31, 33, 35, and 37 are shown to have similar dimensions as the above described embodiments. In the present embodiment, manipulation of the spacer dimensions to achieve a desired result is accomplished by providing conductive lines with differently dimensioned conductive portions. In the present example, some of the conductive material comprising conductive lines 34a and 36a has been removed. Thus, conductive line height or thickness is manipulated not through the selective removal of insulative caps, but rather through the manipulation of the amounts of conductive material utilized to form the respective conductive lines. Accordingly, it should be apparent that although the peripheral area lines are illustrated to have reduced conductive portions ($C_2$) relative to conductive portions $C_1$ of the memory array conductive lines, the desired line projection differential can be achieved by adding conductive material to the conductive portions of the memory array conductive lines.

It will also be apparent that there are a number of ways to achieve conductive lines having reduced conductive portions relative to other conductive lines. For example, certain patterned lines might simply be thinned down relative to other conductive lines through suitable removal techniques such as masked etching. Another way of providing such lines might be to pattern some, but not all of the lines and then form additional conductive material over unpatterned regions. Subsequently, the unpatterned regions can be patterned to provide resultant line constructions with thicker conductive portions.

The above described methodology provides for more standardization of the dimensions of sidewall spacers which are formed relative to conductive lines which are not necessarily uniformly spaced or disposed relative to one another over a substrate. Such enhances device performance with little extra processing requirements. The inventive methodology can be employed in processing scenarios where devices with greater hot-electron injection capabilities are desired to be formed. Additionally, ESD devices with lower snap-back voltages may be formed utilizing the inventive methodology. Such was described above in connection with forming insulative caps over only some of the conductive lines in peripheral area 16 to provide larger-dimensioned spacers relative to those lines having the insulative caps. The inventive methodology can also be utilized to form conductive lines having variable elevational heights relative to one another, with the resultant sidewall spacers formed thereover having variable dimensions as well. Additionally, it will be appreciated that although the invention has been described in the context of memory devices and in particular DRAM integrated circuitry, non-memory integrated circuitry can be formed in accordance with the invention as well.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming memory circuitry comprising:
providing a substrate having a memory array area for supporting memory circuitry to be formed, and a peripheral area spaced from the memory array area, the substrate having a substrate outer surface;
forming a layer of conductive material over the substrate outer surface to a greater thickness over the memory array area than over the peripheral area;
forming a layer of first insulative material over the layer of conductive material;

patterning and etching at least the layer of conductive material to form at least a first plurality of conductive lines over the memory array area and the peripheral area, the first plurality of conductive lines respectively consisting of a singular conductive mass and at least one dielectric layer, the first plurality of conductive lines having respective sidewalls defining respective line elevations relative to the substrate outer surface, at least some of the line elevations in the memory array area being greater than at least some of the line elevations in the peripheral area; and in a plurality of steps which include at least one common etching step, forming and anisotropically etching second insulative material over the first plurality of conductive lines to form insulative sidewall spacers about the respective sidewalls.

2. The method of claim 1 further comprising forming at least one storage capacitor in the memory array area.

3. The method of claim 1, wherein the memory array area constitutes a portion of a static random access memory device.

4. The method of claim 1, wherein the memory array area constitutes a portion of a dynamic random access memory device.

5. A method of forming dynamic random access memory (DRAM) circuitry comprising:

providing a substrate having a memory array area for supporting DRAM circuitry to be formed, and a peripheral area spaced from the memory array area;

forming a layer of conductive material over the substrate to a greater thickness over the memory array area than over the peripheral area;

forming a layer of first insulative material over the conductive material;

patterning and etching at least the conductive material to form at least a first plurality of conductive lines over the memory array area and the peripheral area, the first plurality of conductive lines respectively consisting of a singular conductive mass and at least one dielectric layer, the first plurality of conductive lines having respective sidewalls defining respective line elevations, at least some of the line elevations in the memory array area being greater than at least some of the line elevations in the peripheral area;

in a plurality of steps which include at least one common etching step, forming and anisotropically etching second insulative material over the first plurality of conductive lines to form insulative sidewall spacers about the respective sidewalls;

forming a layer of storage node material over the memory array area and between at least some of the first plurality of conductive lines;

forming a dielectric layer over the layer of storage node material;

forming a cell plate layer operatively adjacent the dielectric layer to provide at least one storage capacitor relative to the memory array; and forming a bit line contact operatively associated with the one storage capacitor.

6. The method of claim 1 wherein the first plurality of conductive lines respectively define at least first and second relative line spacings therebetween which are different from one another in the peripheral area as compared to the array area.

7. The method of claim 1 wherein the conductive mass comprises conductively doped polysilicon.

8. The method of claim 1 wherein the conductive mass comprises a silicide.

9. The method of claim 1 wherein the conductive mass comprises conductively doped polysilicon and a silicide.

10. The method of claim 1 wherein the first insulative material comprises $SiO_2$.

11. The method of claim 5 wherein the first plurality of conductive lines respectively define at least first and second relative line spacings therebetween which are different from one another in the peripheral area as compared to the array area.

12. The method of claim 5 wherein the conductive mass comprises conductively doped polysilicon.

13. The method of claim 5 wherein the conductive mass comprises a silicide.

14. The method of claim 5 wherein the conductive mass comprises conductively doped polysilicon and a silicide.

15. The method of claim 5 wherein the first insulative material comprises $SiO_2$.

* * * * *